US009588998B2

(12) United States Patent
Liu et al.

(10) Patent No.: US 9,588,998 B2
(45) Date of Patent: *Mar. 7, 2017

(54) PROTECTING STORAGE DATA DURING SYSTEM MIGRATION

(71) Applicant: International Business Machines Corporation, Armonk, NY (US)

(72) Inventors: Su Liu, Round Rock, TX (US); Shunguo Yan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 255 days.

This patent is subject to a terminal disclaimer.

(21) Appl. No.: 14/040,842

(22) Filed: Sep. 30, 2013

(65) Prior Publication Data

US 2015/0039569 A1 Feb. 5, 2015

Related U.S. Application Data

(63) Continuation of application No. 13/956,656, filed on Aug. 1, 2013.

(51) Int. Cl.
  G06F 17/30 (2006.01)
  G06F 17/22 (2006.01)
  H03M 7/00 (2006.01)

(52) U.S. Cl.
  CPC ........ *G06F 17/303* (2013.01); *G06F 17/2217* (2013.01); *G06F 17/2288* (2013.01); *G06F 17/30371* (2013.01); *H03M 7/00* (2013.01)

(58) Field of Classification Search
  CPC ......... G06F 17/30067; G06F 17/30008; G06F 17/303; G06F 17/30371; G06F 17/2217; G06F 17/2288; G06F 11/1471; H03M 7/00

(Continued)

(56) References Cited

U.S. PATENT DOCUMENTS 5,537,628 A * 7/1996 Luebbert ................. G06F 17/24
  715/208
5,784,071 A * 7/1998 Tang .................... G06F 17/2223
  345/467

(Continued)

OTHER PUBLICATIONS

Ohshima et al., "The Design and Implementation of Multilingualized Squeak", In Proceedings of the International Conference on Creating, Connecting and Collaborating through Computing (C5), Jan. 2003, 8 pages.*

(Continued)

*Primary Examiner* — Phuong Thao Cao
(74) *Attorney, Agent, or Firm* — Thomas E. Tyson; Gregory K. Goshorn; Greg Goshorn, P.C.

(57) ABSTRACT

Provided are techniques for determining whether a character code point value of a first plurality of character code point values corresponds to a second character code point value from a second plurality of character code point values, first value associated with a first encoding version and the second value associated with a second encoding. In response to the first value does not corresponding to any of the second character code point values, a determination is made as to whether the value corresponds to a third character code point value of a third plurality of code point values stored in a character value record table (CVRT). In response the value corresponding to the third value, an entry in the CVRT that associates the character with the third value is made; and the character is stored in conjunction with an application associated with the second encoding using the third value.

7 Claims, 6 Drawing Sheets

(58) Field of Classification Search
USPC ........................................................ 707/691
See application file for complete search history.

(56) References Cited

U.S. PATENT DOCUMENTS

| | | | | |
|---|---|---|---|---|
| 5,793,381 | A * | 8/1998 | Edberg | G06F 17/2223 345/467 |
| 5,802,539 | A * | 9/1998 | Daniels | G06F 17/21 704/7 |
| 6,055,365 | A * | 4/2000 | Tye | G06F 8/51 716/123 |
| 6,138,086 | A * | 10/2000 | Rose | G06F 17/2205 704/8 |
| 6,141,002 | A * | 10/2000 | Kanungo | H04N 21/40 348/E5.002 |
| 6,400,287 | B1 * | 6/2002 | Ehrman | G06F 3/0219 341/22 |
| 6,560,596 | B1 * | 5/2003 | Margulies | G06F 17/30569 707/690 |
| 6,771,267 | B1 * | 8/2004 | Muller | G06T 11/00 345/467 |
| 6,829,620 | B2 * | 12/2004 | Hsing | G06F 17/30569 |
| 7,013,289 | B2 * | 3/2006 | Horn | G06Q 10/087 705/14.51 |
| 7,051,278 | B1 * | 5/2006 | Ehrman | G06F 17/2223 704/2 |
| 7,191,114 | B1 * | 3/2007 | Murray | G06F 17/275 704/2 |
| 7,240,066 | B2 * | 7/2007 | Burchall | G06F 17/2217 |
| 7,278,100 | B1 * | 10/2007 | Ehrman | G06F 17/2217 704/2 |
| 7,797,149 | B2 | 9/2010 | Degenhardt et al. | |
| 9,047,511 | B1 * | 6/2015 | Vargis | G06K 9/348 |
| 2001/0037337 | A1 * | 11/2001 | Maier | G06F 17/30067 |
| 2002/0156688 | A1 * | 10/2002 | Horn | G06Q 10/087 705/14.51 |
| 2003/0009447 | A1 * | 1/2003 | Murray | G06F 17/2217 |
| 2004/0044791 | A1 * | 3/2004 | Pouzzner | G06F 17/22 709/245 |
| 2004/0081434 | A1 * | 4/2004 | Jung | G11B 27/10 386/244 |
| 2004/0205675 | A1 * | 10/2004 | Veerappan | G06F 17/2217 715/255 |
| 2004/0237046 | A1 * | 11/2004 | Burchall | G06F 17/2217 715/256 |
| 2004/0267843 | A1 * | 12/2004 | Dinh | G06F 17/30569 708/204 |
| 2005/0071346 | A1 * | 3/2005 | Bernal | G06F 17/30433 |
| 2007/0115488 | A1 * | 5/2007 | Engelman | G06F 17/214 358/1.13 |
| 2007/0176802 | A1 * | 8/2007 | Fay | G06F 17/2217 341/50 |
| 2008/0072142 | A1 | 3/2008 | Yao | |
| 2009/0089332 | A1 * | 4/2009 | Harger | G06F 17/30303 |
| 2011/0037625 | A1 * | 2/2011 | Joyce | G06F 17/2217 341/51 |
| 2011/0128167 | A1 * | 6/2011 | Schneider | H03M 7/3086 341/51 |
| 2011/0188761 | A1 * | 8/2011 | Boutros | H04N 1/60 382/218 |
| 2012/0124067 | A1 * | 5/2012 | Liu | G06Q 10/105 707/758 |
| 2012/0317134 | A1 * | 12/2012 | Bourbonnais | G06F 17/30371 707/769 |
| 2013/0033720 | A1 * | 2/2013 | Hirayama | G06F 3/1206 358/1.14 |
| 2013/0176589 | A1 * | 7/2013 | Nakamura | G06F 3/1297 358/1.15 |
| 2013/0262490 | A1 * | 10/2013 | Hsieh | G06F 17/30005 707/756 |
| 2013/0275403 | A1 * | 10/2013 | Liu | G06F 17/30471 707/706 |
| 2014/0041005 | A1 * | 2/2014 | He | H04L 63/08 726/7 |
| 2015/0039569 | A1 * | 2/2015 | Liu | G06F 17/30371 707/691 |

OTHER PUBLICATIONS

Foller, "Online Sample of a CharSet Property for Conversion Texts and Files," Motobit Software , downloaded Aug. 1, 2013 from <http://www.motobit.com/util/charset-codepage-conversion.asp>, © 1998-2013.

Cerf, "Program for Internationalization & Unicode Conference," Santa Clara, CA, Oct. 22-24, 2012.

* cited by examiner

Figure 3

CVRT 154

| | COL_1 201 | COL_2 202 | COL_3 203 | COL_4 204 | COL_5 205 | COL_6 206 | COL_7 207 |
|---|---|---|---|---|---|---|---|
| ROW_1 210 | 211 CHAR NAME | 212 CURRENT CODE POINT IN OS_2 IN CURRENT VERSION | 213 CODE POINT VALUE IN OS_3 & VERSION_4 | 214 CODE POINT VALUE IN OS_3 & VERSION_3 | 215 CODE POINT VALUE IN OS_3 & VERSION_2 | 216 CODE POINT VALUE IN OS_3 & VERSION_1 | 217 NOTE |
| ROW_2 220 | 221 A | 222 0x4E00 (A6) | 223 0x4E00 (A6) | 224 0x4E00 (A6) | 225 0x4E00 (A6) | 226 0x4E00 (A6) | 227 NEVER CHANGED |
| ROW_3 230 | 231 B | 232 0x2116 (B6) | 233 0x2116 (B6) | 234 0xF86F (B5) | 235 0xF86F (B5) | 236 0xF86F (B5) | 237 CHANGED ONCE |
| ROW_4 240 | 241 C | 242 0x3447 (C6) | 243 0x3447 (C6) | 244 0xE81B (C3) | 245 0xE81B (C3) | 246 0xE81A (C1) | 247 CHANGED > 2 |
| ROW_5 250 | 251 D | 252 | 253 0xF8FF (D4) | 254 0xF8FF (D4) | 255 0xF8FF (D4) | 256 0xF8FF (D4) | 257 NO MATCH |

US 9,588,998 B2

PROTECTING STORAGE DATA DURING SYSTEM MIGRATION

CROSS-REFERENCES TO RELATED APPLICATIONS

The present application is a continuation and claims the benefit of the filing date of an application entitled, "Protecting Storage Data During System Migration" Ser. No. 13/956,656, filed Aug. 1, 2013, assigned to the assignee of the present application, and herein incorporated by reference.

FIELD OF DISCLOSURE

The claimed subject matter relates generally to computing systems and, more specifically, to techniques for the migration of data from one type of computing system to another type.

BACKGROUND OF THE INVENTION

Migrating, switching, or porting a system from an old one to a new one can be complex, intensive and error-prone. For one example, data, such as databases and files, may be difficult to port from a SOLARIS® or HP-UX® operating system (OS) to an AIX® OS. Another common example is the porting of data from an ORACLE® database to a DB2® database.

Data migration often requires data encoded content updates from the original system to the new one. Data incompatibility issues may occur because new systems might use different encoding standards or different versions of the same encoding standard. There are many encoding conversion tools, such as but not limited to Unix command and API "iconv," for converting data from one encoding to another, or from one version to another in the same encoding system. However, such tools often require knowledge of the original encoding version, which is often difficult or even impossible to determine because databases and file systems may not store data encoding version information. For example, for a database table that was created in 1995 to store UTF-8 data, data might have been stored in Unicode from version 3 to version 6 during the last 15 years without specifying what data record was stored in what version of the Unicode.

Moreover, code points for certain characters may be vendor-defined in Private User Area (PUA) of the Unicode table. Different vendors may define different code points for the same character or same code point for different characters. Later, the vendor-defined PUA character may be deprecated and promoted into an official character in the Unicode table with a new code point. A document or database containing such characters may be incompatible among different systems, and thus may not be convertible from one system directly to another.

Conflicts often exist in accumulated records collection databases, storages, or file systems such as health record management system, digitized libraries, and banking databases. After character mapping has changed from an original system to a migrated, or switched/ported, system, the characters encoded as old value may not be accessible. Such records are called "ghost records." Moreover, ghost records may be lost or corrupted during data/system migration due to the lack of a character mapping deriving mechanism on current migration tools. Further, users may not realize that there are ghost records or corrupted data in their migrated systems because it is hard to get warnings to report, trace and correct ghost records during system migration.

SUMMARY

Provided are techniques for facilitating data migration by detecting incompatible characters, matching historic code values of a given character and converting the old value to the code value used in the new system. Incompatible and historic values of characters are defined in a character value record table, which contains information on incompatible characters whose value have either changed or been redefined since the beginning of a particular encoding system. In addition, information is maintained concerning code values of characters used by different OSs, crossing platforms, applications and vendors.

One embodiment of the claimed subject matter includes determining whether or not a first character code point value, corresponding to a first character, of a first plurality of character code point values corresponds to a second character code point value from a second plurality of character code point values, wherein the first character code point value is associated with a first encoding version, the second character code point value is associated with a second encoding version and the first and second encoding versions are different encoding versions; in response to a determination that the first character code point value does not correspond to any of the second plurality of character code point values, determining whether or not the first character code point value corresponds to a third character code point value of a third plurality of code point values stored in a character value record table (CVRT); and in response to a determination that the first character code point value corresponds to the third character code point value; generating an entry in the CVRT that associates the character with the third character code point value; and storing the character, using the third code point value, in conjunction with an application associated with the second encoding This summary is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed description.

BRIEF DESCRIPTION OF THE DRAWINGS

A better understanding of the claimed subject matter can be obtained when the following detailed description of the disclosed embodiments is considered in conjunction with the following figures, in which:

FIG. 3 is an example of a simple character value record table (CVRT), first introduced in FIG. 2, used to describe the claimed subject matter.

DETAILED DESCRIPTION

Figure 1:
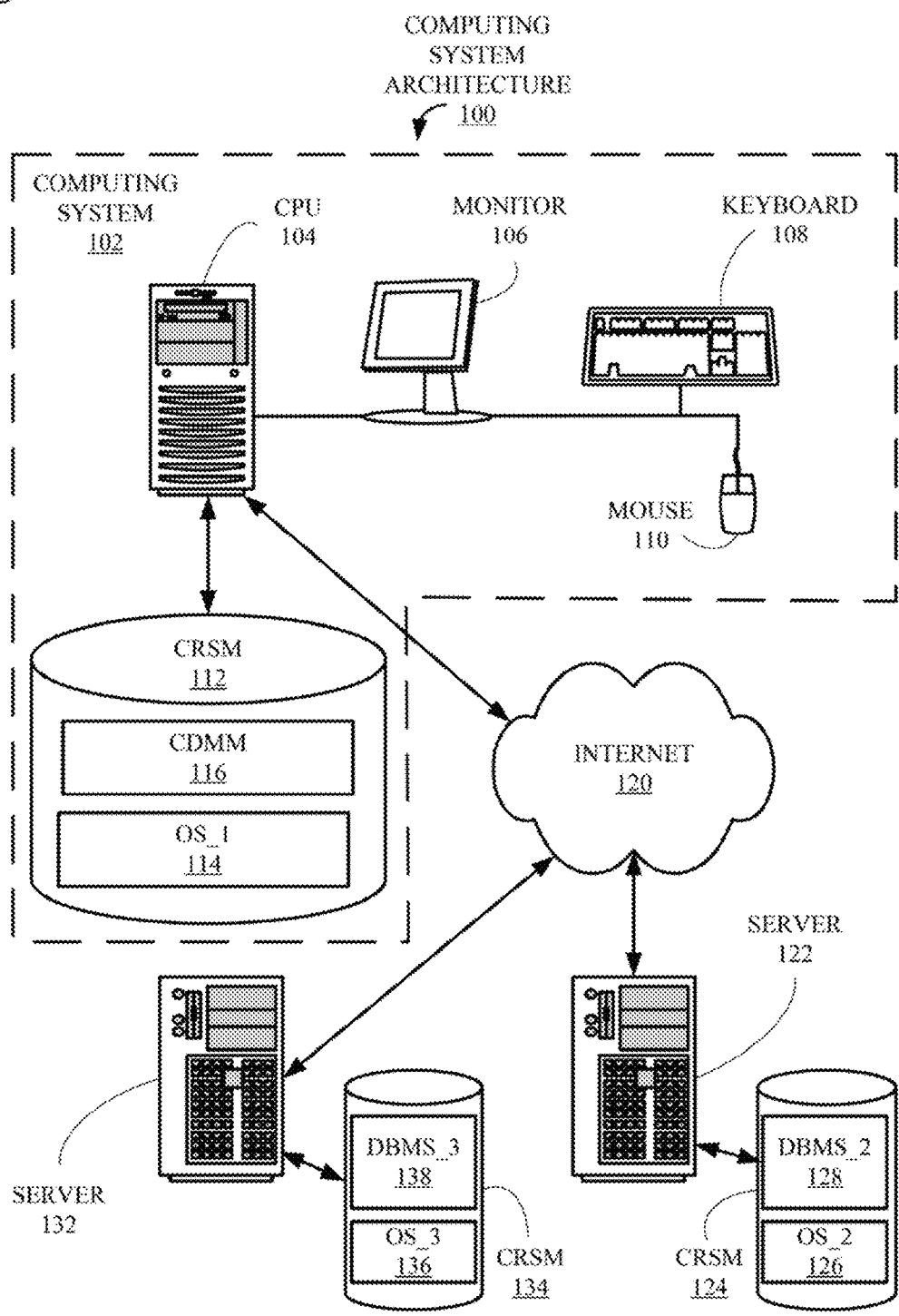
FIG. 1 is a block diagram of a computing system architecture that may implement the claimed subject matter.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational actions to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Turning now to the figures, FIG. 1 is a block diagram of an exemplary computing system architecture 100 that may implement the claimed subject matter. A computing system 102 includes a central processing unit (CPU) 104, coupled to a monitor 106, a keyboard 108 and a pointing device, or "mouse," 110, which together facilitate human interaction with elements of architecture 100 and computing system 102. Also included in computing system 102 and attached to CPU 104 is a computer-readable storage medium (CRSM) 112, which may either be incorporated into computing system 102 i.e. an internal device, or attached externally to CPU 104 by means of various, commonly available connection devices such as but not limited to, a universal serial bus (USB) port (not shown). CRSM 112 is illustrated storing an operating system (OS), i.e. a OS_1 114, and a Character Detection and Migration Module (CDMM) 116 that incorporates the claimed subject matter.

In this example, computing system 102 and CPU 104 are connected to the Internet 120, which is also connected to a server computer, or simply "server," 122 and a server 132. Although in this example, computing system 102 and servers 122 and 132 are communicatively coupled via the Internet 120, they could also be coupled through any number of communication mediums such as, but not limited to, a local area network (LAN) (not shown). Server 122 and server 132 are each coupled to a CRSM, i.e. a CRSM 124 and a CRSM 134, respectively. Server 122 is illustrated executing an OS, i.e. an OS_2 126, and a database management system (DBMS), i.e. DBMS_2 128. Server 132 is illustrated executing an OS, i.e., and OS_3 136, and a DBMS, i.e. DBMS_3 138. OS_2 126, DBMS_2 128. OS_3 136 and DBMS_3 138 are used, within the following description, merely as examples of OSs and applications that may employ the claimed subject matter. Specifically, the example describes the porting of data from DBMS_3 138 to DBMS_2 128 in accordance with the claimed subject matter. Examples of OSs that may be employed in conjunction with the claimed subject matter include, but are not limited to, SOLARIS®, HP-UX®, AIX® and so on. Examples of DBMSs include, but are not limited to, an ORACLE® DBMS and a DB2® DBMS. Those with skill in the relevant arts should realize that the claimed subject matter is equally applicable for data migration issues related to many OSs and applications, including applications other than DBMSs. Further, it should be noted there are many possible computing system configurations, of which computing system 100 is only one simple example.

Figure 2:
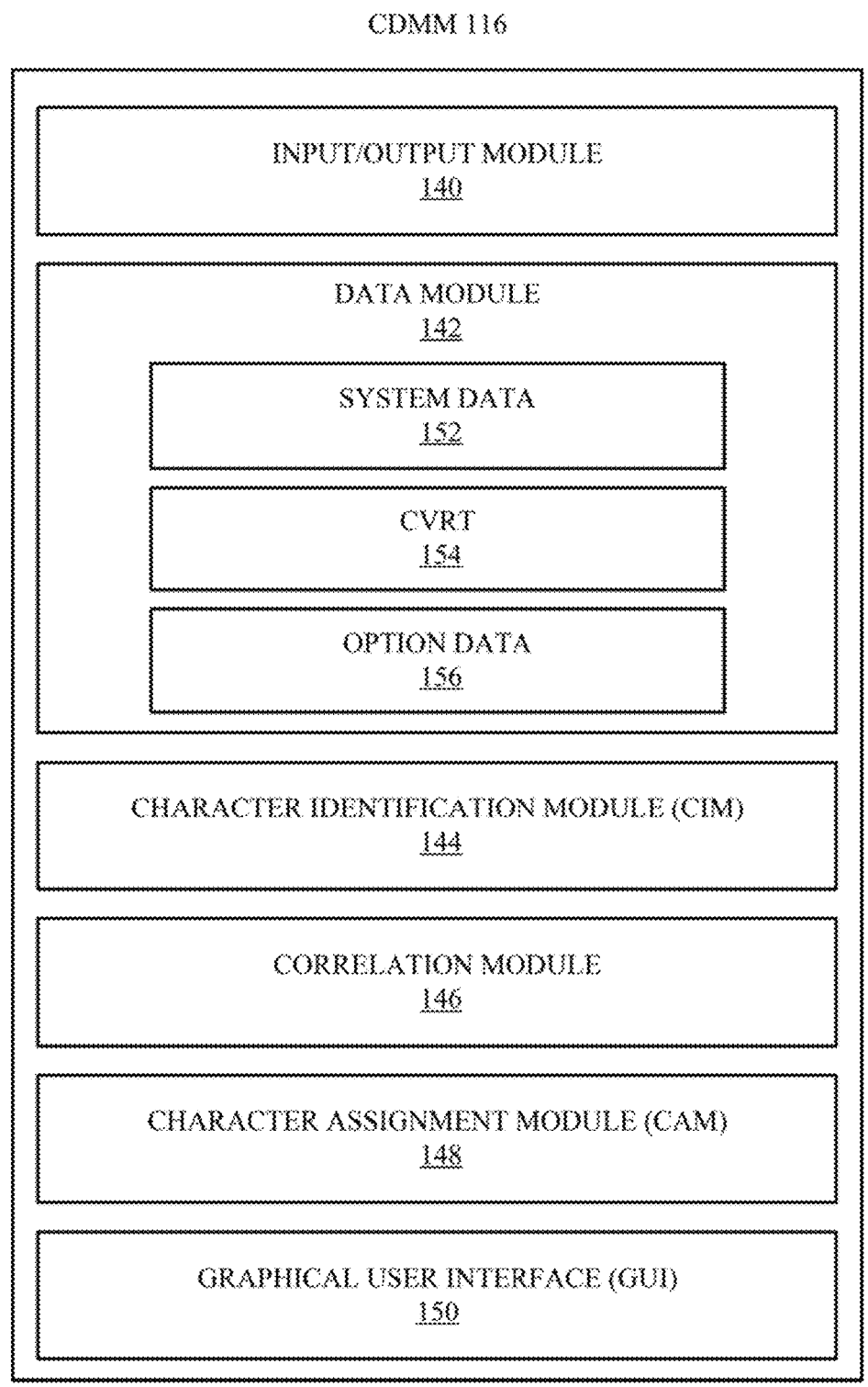
FIG. 2 is a block diagram of a Character Detection and Migration Module (CDMM) that may implement aspects of the claimed subject matter.

FIG. 2 is a block diagram of CDMM 116, introduced above in FIG. 1, in greater detail. CDMM 116 includes an input/output (I/O) module 140, a data module 142, a character identification module (CIM) 144, a correlation module 146, a character assignment module (CAM) 148 and a graphical user interface (GUI) module 150. For the sake of the following examples, CDMM 116 is assumed to execute on computing system 102 (FIG. 1) and stored in CRSM 112 (FIG. 1). It should be understood that the claimed subject matter can be implemented in many types of computing systems and data storage structures but, for the sake of simplicity, is described only in terms of computing system 102 and architecture 100 (FIG. 1). Further, the representation of CDMM 116 in FIG. 2 is a logical model. In other words, components 140, 142, 144, 146, 148 and 150 may be stored in the same or separates files and loaded and/or executed within architecture 100 and computing system 102 either as a single system or as separate processes interacting via any available inter process communication (IPC) techniques.

I/O module 140 handles any communication CDMM 116 has with other components of architecture 100 and computing system 102. Data module 142 is a data repository for information, including settings, tables and lists, that CDMM 116 requires during operation. Examples of the types of information stored in data cache 142 include system data 152, a character value record table (CVRT) 154 and option data 156.

System data 152 stores information about systems which may utilize CDMM 116 for data migration purposes. For example, system data 152 may include information about data coding techniques and conventions of systems that might employ the disclosed techniques such as, but not limited to, OS_2 126, DBMS_1 128, OS_3 136 and DBMS_3 138, all of which were introduced above in conjunction with FIG. 1. CVRT 154 stores data used to implement the disclosed technology and is described in more detail below in conjunction with FIGS. 3-6.

Option data 156 includes information on various user and administrative preferences that have been set. For example, information concerning an alternative CVRT, accessible over Internet 120, may be provided for the situation in which CVRT 154 does not include necessary information. Other options may specify channel and personnel for notification purposes.

Figure 4:
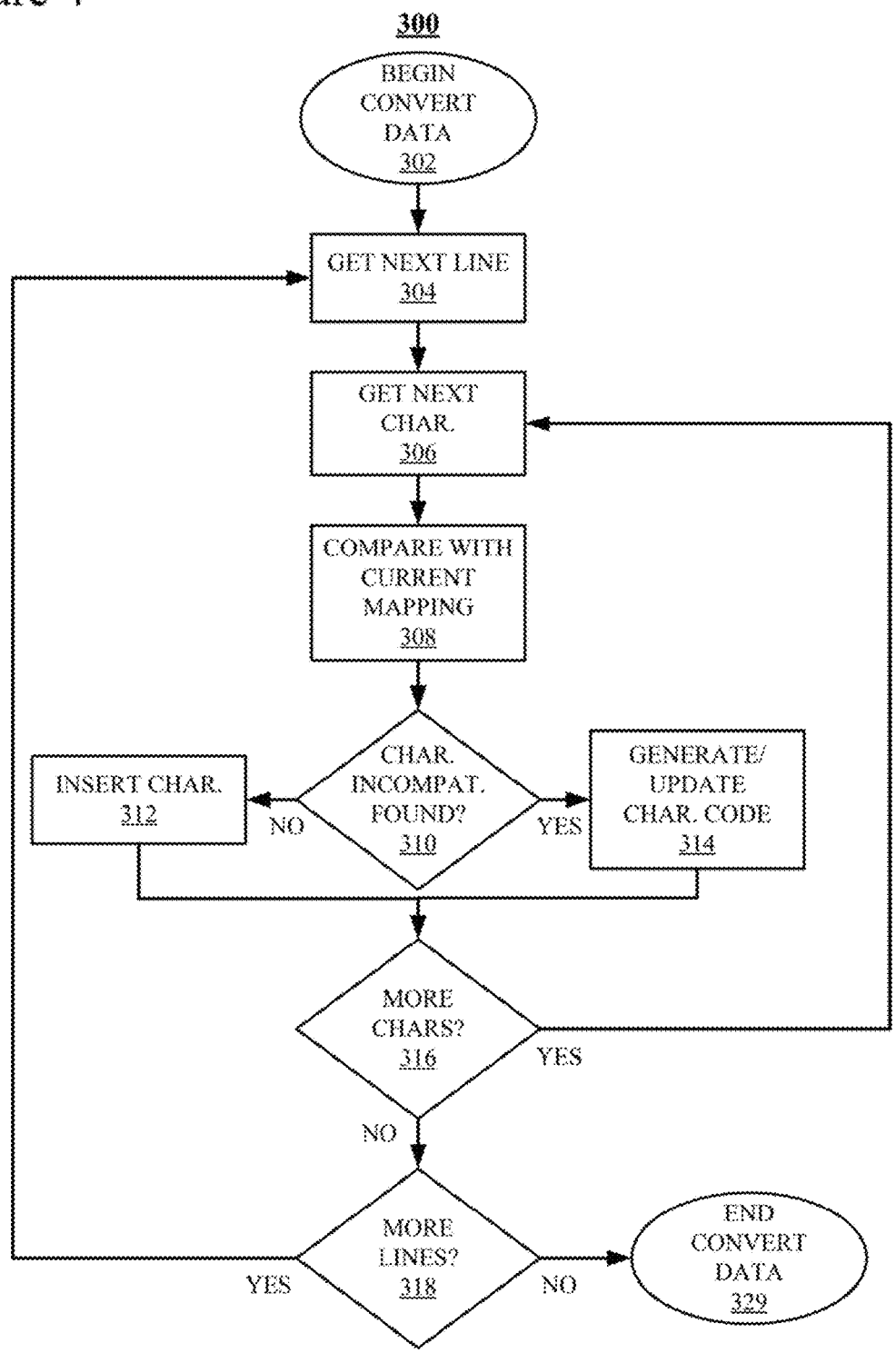
FIG. 4 is a flowchart of a Covert Data process that may be used in conjunction with the claimed subject matter.

Briefly, CIM 144 is responsible for the identification of characters to be processed (see 304, 306, FIG. 4). Correlation module 146 is responsible for matching a character identified by CIM 144 with characters stored in CVRT 154 (see 308, FIG. 4). CAM 148 is responsible for assigning a new code point to any character identified by CIM 144 for which correlation module 146 fails to find a match.

GUI component 150 enables users and administrators of CDMM 116 to interact with and to define the desired functionality of CDMM 116, typically by setting parameters on option data 156. Components 140, 142, 144, 146, 148, 150, 152, 154 and 156 are described in more detail below in conjunction with FIGS. 3-6

FIG. 3 is one example of a CVRT, i.e., CVRT 154 (FIG. 2), that may be employed in conjunction with the claimed subject matter. It should be noted that data such as character names, code points, and version numbers used in the following examples may not correspond to actual data but are rather might be pseudo-values and pseudo-names used merely for descriptive purposes. CVRT 154 includes a number of columns, i.e. a COL_1 201, a Col_2 202, a Col_3 203, a Col_4 204, a Col_5 205, a Col_6 206 and a Col_7 207, and a number of rows, i.e., a Row_1 210, a Row_2 220, a Row_3 230, a Row_4 240 and a Row_5 250. Col_1 201 includes a cell 211, which is the heading, or "Character (Char.) Name," for Col_1 201 and several examples of defined characters, i.e., an 'A' in a cell 221, a 'B' in a cell 231, a 'C' in a cell 241 and a 'D' in a cell 251.

Columns 212-216 store code point values for the corresponding characters in rows 220, 230, 240 and 250. A heading, or "Current Code Point in OS_2 in Current Version," in a cell 212 describes data stored in Col_2 202. In other words, Col_2 202 stores a current code point value in OS_2 126 (FIG. 1) for the characters 'A', 'B', 'C' and 'D' in rows 220, 230, 240 and 250, respectively. In the following example, the code point value of the character 'A' in the current version of OS_2 126 is "0x4E00" as listed in a cell 222. In a similar fashion, a cell 232 stores the value "0x2116" for the character 'B', a cell 242 stores the value "0x3447" for the character 'C' and a cell 252 is blank, which indicates that there is no code value corresponding to the character 'D' in the current version of OS_2 126.

Cells 223, 233, 243 and 253 of Col_3 203, which has a heading "Code Point Value in OS_3 & Version 4" in a cell 213, store information for the corresponding rows 220, 230, 240 and 250 that lists the corresponding code point values for the characters 'A', 'B', 'C' and 'D' in a version 4 of OS_3 136 (FIG. 1). Cells 224, 234, 244 and 254 of Col_4 204, which has a heading "Code Point Value in OS_3 & Version 3" in a cell 214, stores information for the corresponding rows 220, 230, 240 and 250 that lists the corresponding code point values for the characters 'A', 'B', 'C' and 'D' in a version 3 of OS_3 136. Cells 225, 235, 245 and 255 of Col_5 205, which has a heading "Code Point Value in OS_3 & Version 2" in a cell 215, stores information for the corresponding rows 220, 230, 240 and 250 that lists the corresponding code point values for the characters 'A', 'B'. 'C' and 'D' in a version 2 of OS_3 136. Cells 226, 236, 246 and 256 of Col_6 206, which has a heading "Code Point Value in OS_3 & Version 1" in a cell 216, stores information for the corresponding rows 220, 230, 240 and 250 that lists the corresponding code point values for the characters 'A', 'B', 'C' and 'D' in a version 1 of OS_3 136.

Cells 227, 237, 247 and 257 of Col_7 207, which has a heading "Note" in a cell 217, merely provides additional information about the code point values in the corresponding rows 220, 230, 240 and 250. For example, cell 227 notes that the code point values in row 220 have not changed throughout the various versions, cell 237 notes that the code point values in row 230 have had one change, cell 247 notes that the code point values in row 240 have changed greater than two (2) times and cell 257 notes that there is no matching code point in OS_2 126 for the character 'D' in row 250.

References after each code point value merely provide a short reference to the corresponding code point value. For example, the "(A6)" after the code point value in cell 222 indicates that that the code point value is the sixth ($6^{th}$) code point version for the corresponding character 'A'. In a similar fashion, a code point history for the character 'A' and row 220 can be shortened to ['A', A6]; for 'B' and row 230 to ['B', B6, B5]; for 'C' and row 230 to ['C', C6, C3, C1]; and for 'D' and row 250 to ['D', BLANK, D4]. This notation is employed below to simplify description of the disclosed technology.

It should be noted that CVRT 154 is merely one simple example of a code value record table that is used for the purposes of illustration and that an actual CVRT would typically include, but is not limited to, many more characters, OSs and versions in addition to those illustrated in CVRT 154. The use of CVRT 154 in conjunction with the claimed subject matter is explained more fully below in conjunction with FIGS. 4-6.

FIG. 4 is a flowchart of a Covert Data process 300 that may be used in conjunction with the claimed subject matter. In this example, logic associated with process 300 is stored on CRSM 112 (FIG. 1) as part of CDMM 116 (FIGS. 1 and 2) and executed on one or more processors of CPU 104 (FIG. 1) of computing system 102 (FIG. 1). In addition, the following example will be a conversion of data stored in DBMS_3 138 (FIG. 1) operating under OS_3 136 (FIG. 1) to data stored in a DBMS_2 128 (FIG. 1) operating under OS_2 126 (FIG. 1). It should be noted that, in this particular example, both of operating systems 126 and 136 are different than OS_1 114 (FIG. 1) on which CDMM 116 is executing. The disclosed technology may execute on one OS to convert data from the same or unrelated OSs.

Process 300 starts in a "Begin Covert Data" block 302 and proceeds immediately to a "Get Next Line" block 304. During block 304, a line of data, which may be a record in a database or a line in a file is received to be converted. As explained above, in this example, a record from DBMS_3 138 is retrieved for processing. During processing associated with a "Get Next Character (Char.)" block 306, a first character in the line of data received during processing associated with block 304 is selected. During processing associated with a "Compare With Current Mapping" block 308, the character selected for processing during processing associated with block 306 is compared to characters stored in CVRT 154 (FIGS. 2 and 3).

During processing associated with a "Char. Incompatibility (Incompat.) Found?" block 310, a determination is made as to whether or not the character employs that same code point in OS_3 136 as in OS_2 126. In other words, OS_2 126 and OS_3 136 both use the same code point value for the character being processed. If so, the character is inserted into the appropriate position in DBMS_2 128 during processing associated with an "Insert Char." block 312. If not, processing proceeds to a "Generate/Update Char. Code" block 314, which is explained in more detail below in conjunction with FIG. 5.

Once the character being processed is inserted into DBMS_2 128 or processed in conjunction with block 314, control proceeds to a "More Chars.?" block 316. During processing associated with a block 316, a determination is made as to whether or not there are more characters to be processed in the line of data retrieved during processing associated with block 304. If so, control returns to block 306, the next character is retrieved and processing continues as describe above. If not, control proceeds to a "More Lines?" block 318. During processing associated with block 218, a determination is made as to whether or not there are more lines of data to be retrieved from DBMS_3 138. If so, control returns to block 304, the next line is retrieved and processing continues as describe above. If not, control proceeds to an "End Convert Data" block 329 in which process 300 is complete.

Figure 5:
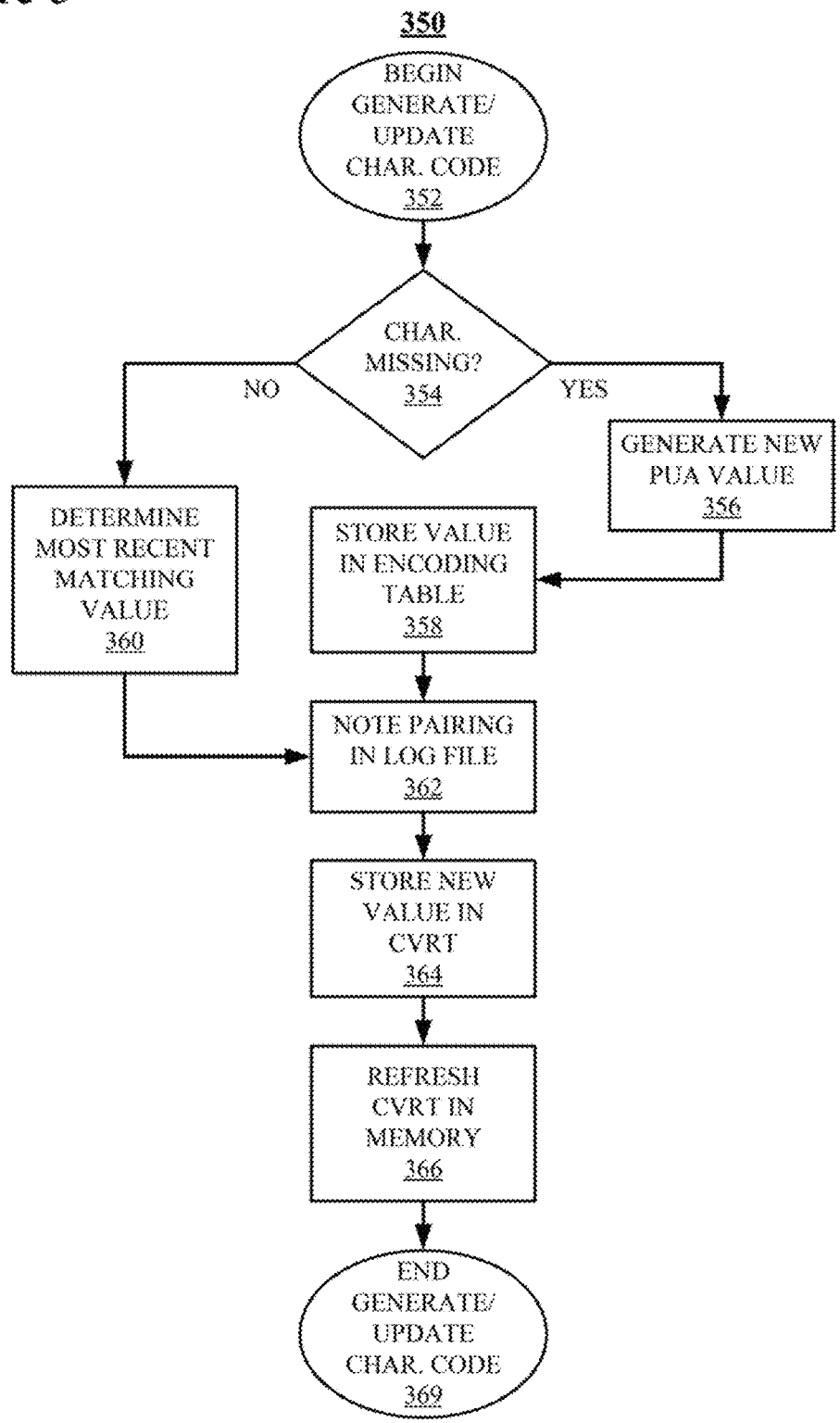
FIG. 5 is a flowchart of a Generate/Update Character (Char.) Code process that may be used in conjunction with the claimed subject matter.

FIG. 5 is a flowchart of a Generate/Update Character (Char.) Code process 350 that may be used in conjunction with the claimed subject matter. Like process 300 (FIG. 4), in this example, logic associated with process 350 is stored on data storage 112 (FIG. 1) as part of CDMM 116 (FIGS. 1 and 2) and executed on one or more processors of CPU 104 (FIG. 1) of computing system 102 (FIG. 1). Process 350 represents processing associated with block 314 (FIG. 4) of process 300.

Process 350 starts in a "Begin Generate/Update Char. Code" 352 and proceeds immediately to a "Char. Missing?" block 354. During processing associated with block 354, a determination is made as to whether or not the character being processed, or "current" character, (see 306, FIG. 4) can be found in CVRT 154 (FIGS. 2 and 3), i.e. whether or not the character is "missing" from CVRT 154. If the current character is missing, control proceeds to a "Generate New Private User Area (PUA) Value" block 356. During processing associated with block 356, a unique value is generated for the current character and, during processing associated with a "Store Value in Encoding Table" block 358, this value is stored in an encoding table (not shown) associated with OS_2 126.

If, during processing associated with block 354, a determination is made that the current character in not missing, control proceeds to a "Determine Most Recent Matching Value" block 360. During processing associated with block 360, the historic code points corresponding to the current character are retrieved from CVRT 154. In this example, the current character is 'C' and code point values will be referred to by the version number, e.g., the character 'C', which is defined in row_4 240 (FIG. 3) of CVRT 154 has code point values "C6," "C3." and "C1" in cells 242-246 (FIG. 3). Starting from the highest code point value, C6, a determination is made as to whether or not the value in the new system is a match. In this example the code point in the new system. OS_2 126, will be assumed to be C3. Since C6 and C3 do not match, the next highest code point value is examined. In this case, C3 and C3 match and so the most recent matching value is "C3."

Once the most recent value is determined, or, during processing associated with block 358, a new value is stored in the encoding table, control proceeds to a "Note Pairing in Log File" block 362. During processing associated with block 362, the new value or the match value is logged in conjunction with the current code point value of the current character. During processing associated with a "Store New Value in CVRT" block 364, the new value or matched value is stored in CVRT 154. In this manner, a particular character only needs to be processed the first time the character is encountered rather than each time. During processing associated with a "Refresh CVRT in Memory" block 366, a persistent version of CVRT 154 is updated so that future processing can take advantage of the current processing. Finally, control proceeds to an "End Generate/Update Char. Code" block 369 in which process 350 is complete.

Figure 6:
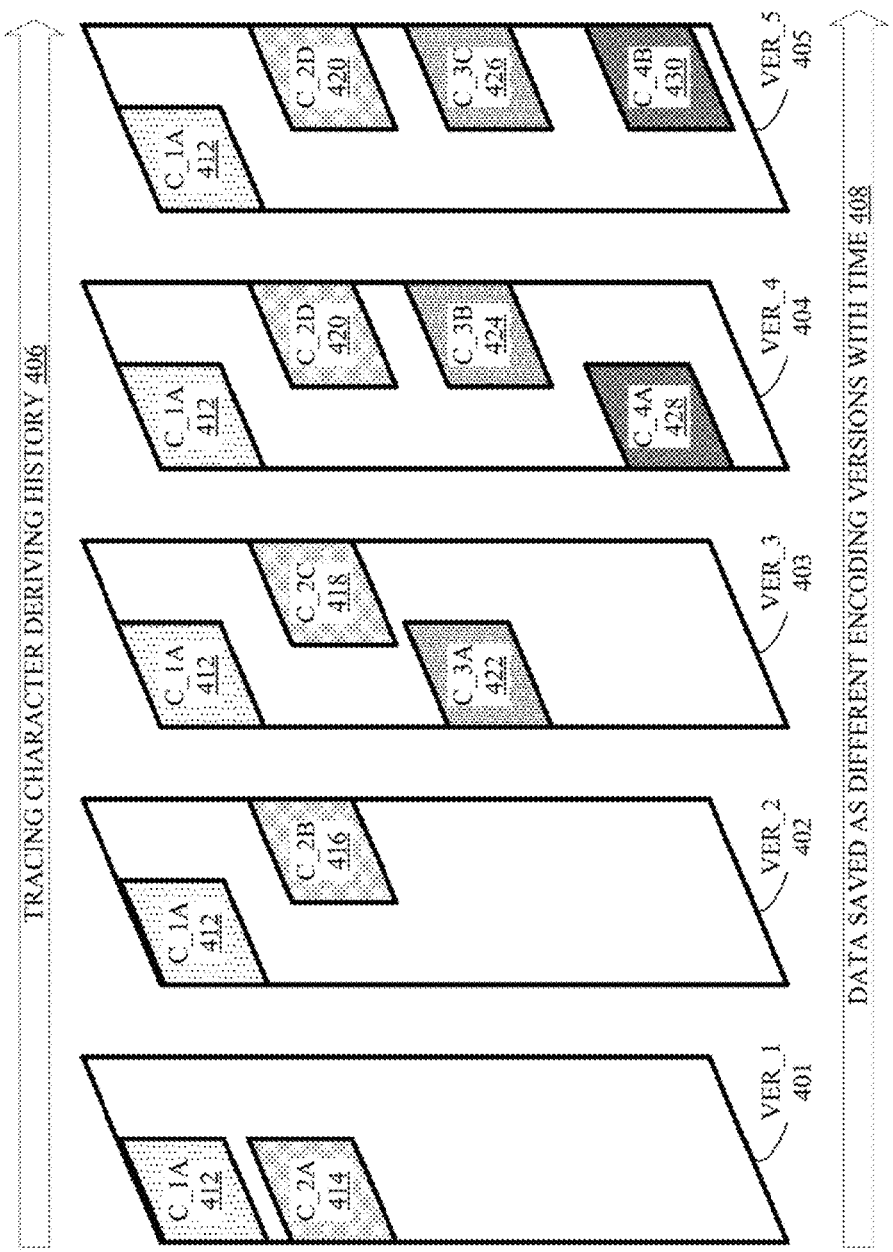
FIG. 6 is an example of a timeline illustrating data version transition and character deriving history in accordance with the disclosed technology.

FIG. 6 is an example of a timeline 400 illustrating data version transition and character deriving history in accordance with the disclosed technology. In this example, several data versions are illustrated, specifically a Ver_1 401, a Ver_2 402, a Ver_3 403, a Ver_4 404 and a Ver_5 405. The various version 401-405 are arranged to illustrate Tracing Character Deriving History 406 and Data Saved as Different Encoding Version With Time 408, both in accordance with the claimed subject matter.

In Ver_1 401, there are two characters, i.e., a C_1A 412 and a C_2A 414. During a transition from Ver_1 401 to Ver_2 402, C_1A 412 has been propagated unchanged while C_2A 414 has been changed to C_2B 416. During a transition from Ver_2 402 to Ver_3 403, C_1A 412 has been propagated unchanged while C_2B 416, which was formerly C_2A 414 in Ver_1 401, has been modified to C_2C 418. In addition a new character has been added to Ver_3 403, i.e., a C_3A 422.

During a transition from Ver_3 403 to Ver_4 404, C_1A 412 has been propagated unchanged while C_2C 418, which was formerly C_2A 414 in Ver_1 401 and C_2B 416 in Ver_2 402, has been modified to C_2D 420. C_3A 422 has been modified to a C_3B 424 and a new character has been introduced, i.e., a C_4A 428.

During a transition from Ver_4 404 to Ver_5 405. C_1A 412 and C_2D 420 have has been propagated unchanged while C_3B 424, which was formerly C_3A 422 in Ver_3 403, has been modified to C_3C 426. C_4A 428 has been modified to a C_4B 430.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

We claim:

1. A method for modifying a character value record table (CVRT) for migrating data from a first computing system to a second computing system, comprising:
    determining, by a processor, whether or not a first character code point value, corresponding to a first character, of a first plurality of character code point values associated with the first computing system corresponds to a second character code point value from a second plurality of character code point values associated with the second computing system, wherein the first character code point value is associated with a first encoding version, the second character code point value is associated with a second encoding version and the first and second encoding versions are different encoding versions;
    in response to a determination that the first character code point value does not correspond to any of the second plurality of character code point values, determining, by the processor, whether or not the first character code point value corresponds to a third character code point value of a third plurality of character code point values, wherein the third character code point value is associated with a third encoding version and the third encoding version is different than both the first and second encoding versions;
    in response to a determination that the first character code point value corresponds to the third character code point value, modifying, by the processor, a character value record table (CVRT) for migrating data from the first computing system to the second computing system and storing, in the CVRT, the first character, using the third character code point value, in conjunction with an application associated with the second encoding version; and
    employing the CVRT on the second computing system for character code conversion of the data migrated from the first computing system.

2. The method of claim 1, further comprising, in response to a determination that the first character code point value does correspond to a particular character code point value of the second plurality of character code point values, storing the first character in the CVRT, using the particular character code point value, in conjunction with an application associated with the second encoding version.

3. The method of claim 1, further comprising, in response to a determination that the first character code point value does not correspond to any character code point value of the third plurality of character code point values:
    assigning a new character code point value to the first character;
    generating an entry in the CVRT that associates the first character with the new character code point value; and
    storing the first character, using the new character code point value, in the CVRT in conjunction with an application associated with the second encoding version.

4. The method of claim 1, wherein the third plurality of character code point values are stored in the CVRT, the method further comprising generating an entry in the CVRT that associates the first character with the third character code point value.

5. The method of claim 1, wherein the first and second encoding versions each correspond to different encoding systems, respectively.

6. The method of claim 1, wherein the application is a database management system (DBMS).

7. The method of claim 6, wherein the DBMS is DB2.

* * * * *